US005920798A

United States Patent [19]

Higuchi et al.

[11] Patent Number: 5,920,798

[45] Date of Patent: Jul. 6, 1999

[54] METHOD OF PREPARING A SEMICONDUCTOR LAYER FOR AN OPTICAL TRANSFORMING DEVICE

[75] Inventors: Hiroshi Higuchi, Katano; Akira Hanafusa, Hirakata; Kuniyoshi Omura, Ikoma; Mikio Murozono, Hirakata; Hideaki Oyama, Neyagawa, all of Japan

[73] Assignee: Matsushita Battery Industrial Co., Ltd., Japan

[21] Appl. No.: 08/864,624

[22] Filed: May 28, 1997

[30] Foreign Application Priority Data

| | | | |
|---|---|---|---|
| May 28, 1996 | [JP] | Japan | 8-132960 |
| Oct. 22, 1996 | [JP] | Japan | 8-279150 |

[51] Int. Cl.[6] .......... C07F 3/06

[52] U.S. Cl. .......... 438/761; 438/763; 438/93; 438/94; 438/95

[58] Field of Search .......... 438/48, 57, 93, 438/94, 95, 97, 761, 763; 544/64; 556/9

[56] References Cited

U.S. PATENT DOCUMENTS

| | | | |
|---|---|---|---|
| 5,157,136 | 10/1992 | Arnold et al. | 556/9 |
| 5,527,909 | 6/1996 | Brennan et al. | 544/64 |

*Primary Examiner*—Charles Bowers
*Assistant Examiner*—Keith Christianson
*Attorney, Agent, or Firm*—Wenderoth, Lind & Ponack, L.L.P.

[57] ABSTRACT

A semiconductor layer for photoelectric transfer device for forming a p-n junction, which has large surface area and uniform film pressure, is formed in the atmosphere under normal pressure for several minutes. The semiconductor layer for forming a p-n junction is composed of a compound semiconductor of a Group II element(selected from the group consisting of Cd, Zn and Hg)-Group VI element (selected from the group consisting of S and Te). A semiconductor layer having a p or n conductive type is formed on a substrate by pyrolytically decomposing an organometallic compound containing a II–VI group atom bond. A semiconductor film is formed on the surface of a substrate by dispersing or dissolving an organometallic compound in a solvent to form a solution, applying ink on the surface of the substrate using a suitable printing method and subjecting to a heat treatment.

13 Claims, 4 Drawing Sheets

25 22 24 23 26 21

METHOD OF PREPARING A SEMICONDUCTOR LAYER FOR AN OPTICAL TRANSFORMING DEVICE

DETAILED DESCRIPTION OF THE INVENTION

1. Technical Field

The present invention relates to a method of preparing a compound semiconductor thin film used for a photoelectric transfer device. More particularly, it relates to a method of preparing a p-n junction semiconductor film which is useful for a solar battery.

2. Background Art

Heretofore, the compound semiconductor, particularly a thin film of a telluride such as mercury telluride, cadmium telluride, etc. has widely been used as a photoelectric transfer device material in the field of the photoelectric transfer industry. The compound has hitherto been produced mainly by a sputtering method, a deposition method, a CVD method and the like. The thin film made by these techniques has desired film properties as the photoelectric transfer device material. However, since all techniques require a vacuum apparatus, there arose a problem in that it is hard to make an uniform film having large surface area and to form a film continuously at high speed or, even if possible, the apparatus is very complicated and expensive.

Examples of the method of forming a thin film having large surface area at low cost include electrodeposition method utilizing the principle of electroplating method, spray method and the like. When using this technique, the device and process become inexpensive but there arose a problem about the uniformity and reproducibility of the film properties in the production of the compound semiconductor thin film having large surface area. Furthermore, since it is necessary to adjust the concentration of tellurium in the solution and pH value and the film forming rate can not be increased because of a dilute solution, there arose a problem about the mass production properties.

Therefore, as the technique of producing the compound semiconductor thin film having large surface area with good reproducibility, using an inexpensive apparatus, there is suggested a method of screen-printing a fine powder paste of the compound semiconductor on a substrate, followed by sintering in a continuous belt furnace, that is, a method of producing a CdS/CdTe solar battery wherein a sintered cadmium telluride (CdTe) film is laminated on a sintered cadmium sulfate (CdS) film (see Japanese Patent Kokoku No. 56-28386). There is also suggested a proximate sublimation method of forming a film by placing a telluride as a material in proximity to an object on which a film is to be formed. This proximate sublimation method is a film making method, which comprises placing a telluride as a material in proximity to an object on which a film is to be formed, heating the telluride to sublime, thereby to redeposit the telluride on the surface maintained at the temperature lower than that of the telluride. However, according to this kind of method, since a substrate is heated to not less than 600° C. so as to form a film, the high-temperature heat resistance is required to the substrate and a low-cost substrate such as soda glass can not be used. Particularly, the coating/sintering method of the former has the extremely excellent feature that the compound semiconductor thin film having large surface area can be continuously formed, uniformly and with good reproducibility, using an inexpensive device and, at the same time, the film making and patterning can be simultaneously conducted. However, since a cadmium telluride film must be formed by coating on the portion where the cadmium telluride film is to be formed, evaporating a solvent and subjecting to a heat treatment in nitrogen at 600 to 700° C. for about 2 hours, there arose a problem about the mass production properties. Furthermore, since the film is formed by mutual solid layer diffusion of bonding particles, a thin film whose thickness is smaller than the particle diameter of the fine powder of the compound semiconductor as the starting material can not be formed and, at the same time, the film had a lot of voids.

SUMMARY OF THE INVENTION

Thus, the first object of the present invention is to provide a method capable of forming a film at low temperature of not more than 600° C. within a short time in the formation of a semiconductor layer of a photoelectric transfer device.

The second object of the present invention is to provide a method for producing a photoelectric transfer device having a p-n junction at low cost, by making use of the feature of the coating/sintering method as large surface area/low cost film forming system.

The present invention directs to a method for producing a semiconductor layer for photoelectric transfer device wherein a semiconductor layer for forming a p or n type is composed of a compound semiconductor of a Group II (selected from the group consisting of Cd, Zn and Hg)-Group VI (selected from the group consisting of S and Te) compound semiconductor, which comprises pyrolytically decomposing an organometallic compound containing a Group II–Group VI atom bond to form a semiconductor layer having at least p or n conductive type.

By pyrolytically decomposing the organometallic compound, the organometallic compound is separated into an organic component and a Group II–Group VI compound, e.g., a telluride of a metal, and the organic component is scattered and separated into the molecular form. However, since the telluride of the metal is obtained in the regularly arranged form, a remarkably dense thin film can be produced.

PREFERRED EMBODIMENT OF THE INVENTION

Figure 1:
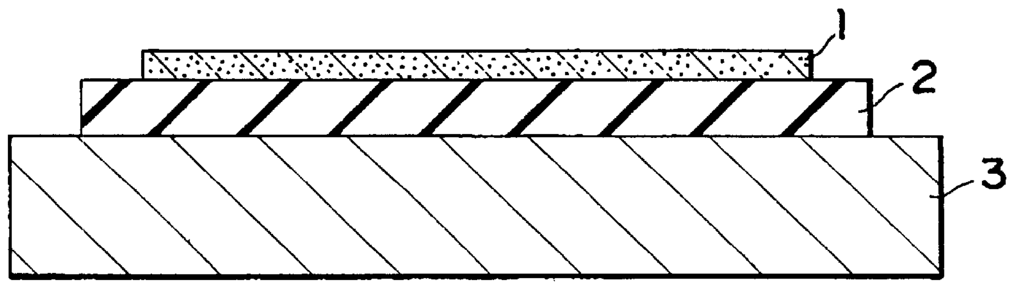
FIG. 1 is a schematic diagram showing a step of the embodiment 1 of the present invention.

Means of the present invention is characterized by using an organometallic compound having a Group II–Group VI atom bond, e.g., organometallic compound having at least one tellurium-metal bond as a material and pyrolytically decomposing it on the surface on which a metal telluride film is to be obtained. This compound is pyrolytically decomposed at the temperature of not more than 600° C., preferably not more than 500° C., and an organic component other than tellurium-metal is separated and scattered to form a metal telluride compound. This reaction can form a metal telluride film on the substrate surface by efficiently evolving the metal telluride compound on the substrate surface utilizing heat from the heated substrate surface.

Accordingly, the first method is characterized by applying the organometallic compound on the substrate surface on which the metal telluride is to be formed, and pyrolytically decomposing the organometallic compound by heating.

The second method is characterized by evolving a gas having a metal-tellurium bond by means for heating the organometallic compound, bringing the gas into contact with the substrate surface heated to high temperature on which the metal telluride film is formed, and pyrolytically decomposing it on the substrate surface.

The third method is characterized by atomizing a powder of an organometallic compound or a solution of the organometallic compound by means for applying ultrasonic vibration, bringing atomized powder or solution into contact with the heated substrate surface on which the metal telluride film is to be formed, and pyrolytically decomposing it on the substrate surface.

Examples of the above Group II–Group VI organometallic compound, which forms a p type semiconductor film, include compounds having a M-Te bond provided M is Cd, Zn or Hg). When the compound is stable to oxygen, water, etc., it is possible to make a film by pyrolysis in the atmosphere containing them. Examples of the compound include compound represented by R-Te-M-Te-R provided M is Cd, Zn or Hg; and R is phenyl, alkylphenyl or fluorophenyl group), for example, bis(phenyltelluro)cadmium, bis(4-methylphenyltelluro)cadmium, bis(2,4,6-trimethylphenyltelluro)cadmium, bis(2,6-dimethylphenyltelluro)cadmium, bis(4-fluorophenyltelluro) cadmium, bis(2,4,6-trifluorophenyltelluro)cadmium, bis (ethyltelluro)cadmium, bis(octyltelluro)cadmium and the like.

Examples of the above II–VI group organometallic compound, which forms a n type semiconductor film, include compounds having a Cd-S bond. Specific examples thereof include mercaptide, thiosulfate, dithiosulfate, thiocarboxylate, dithiocarboxylate, trithiocarboxylate, thiocarbamate and dithiocarbamate of cadmium.

When the above organometallic compound forms a composition for application, a semiconductor film can be formed by applying a paste or solution, prepared by dispersing the above organometallic compound in a solvent, on a substrate according to a printing method or a spin coating method, and evaporating the solvent. As the printing method, there can be used letterpress printing, intaglio printing, lithographic printing, stencil printing or cascade printing. Examples of the solvent in which the above organometallic compound is dispersed or dissolved include 1-methyl-2-pyrrolidone, dimethylformamide, pyridine, γ-butyrolactone, tetralin, dimethyl sulfoxide, toluene, chloroform, alcohols and polyhydric alcohol and a derivative thereof (e.g., Carbitol, Cellosolve, etc.) or water. The organometallic compound can be uniformly dispersed or dissolved in these solvents. Therefore, the organometallic compound can be uniformly applied on the substrate and a semiconductor film having a uniform film thickness can be formed.

The pyrolysis temperature of the organometallic compound is preferably not more than 600° C., and the pyrolysis atmosphere is preferably an inert gas, an inert gas containing oxygen or air. The pyrolysis reaction also depends on the kind of the material. The pyrolysis of the organometallic compound can occur at the temperature of about 200° C., but the particles after formation preferably have a large particle size so as to reduce a grain boundary. When the pyrolysis temperature is low such as about 200° C., the particle size becomes small such as several tens nm. Therefore, the pyrolysis temperature is preferably maintained within the range from 280 to 600° C. By setting the temperature within the above, the pyrolysis is completed within several tens of seconds to several minutes. It also becomes unnecessary to provide a special container for pyrolysis. Incidentally, the pyrolysis can be conducted even at about 400° C. in the inert atmosphere. In case of the atmosphere containing oxygen, the oxidizing reaction of the formed CdTe occurs simultaneously if the temperature is too high, which results in inferior CdTe film. Therefore, the pyrolysis temperature is from 280 to 600° C., more preferably.

Incidentally, when the present method is employed, the applied solution is preferably dried. When heating to not less than 200° C. without drying, the solution transfers onto the applied surface before the solvent is evaporated to form an uneven film thickness distribution, which results in non-uniform film thickness. By drying at low temperature such as about 120° C., it is possible to inhibit the solution from transferring, thereby preventing a non-uniform film thickness.

As the material for substrate, a glass, metal, ceramic or resin film can be used, and one conductive type compound semiconductor film of a p or n type may be formed on the substrate.

When the photoelectric transfer device is a solar battery, cadmium sulfate is used as a p type II–VI group compound semiconductor film and cadmium telluride is used as a p type semiconductor film to be laminated thereon. Accordingly, the present invention is also directed to a solar battery constituted by using a tellurium-metal film, which was made by forming an organometallic compound having at least one tellurium-metal bond on a substrate and pyrolytically decomposing the organometallic compound. The tellurium-metal film made by this production method can produce a high-performance solar battery because of its uniform film thickness.

As described above, according to the present invention, since a low-cost general-duty glass is used as the substrate and the compound semiconductor thin film is formed by the sintering reaction at low temperature for a short time, the mass production can be conducted at high speed. Furthermore, the inert atmosphere is not required at the time of sintering and a thin film having a thickness smaller than the particle size (2 to 4 $\mu$m in case of the coating/sintering) of the raw material can be formed. Furthermore, it is possible to form an uniform film which substantially contains no void in the same sintered film.

Embodiment 1

FIG. 1 shows a first embodiment of the present invention. A substrate 2 on which a metal telluride film is to be formed, wherein a layer 1 of an organometallic compound having at least one tellurium-metal bond is formed on one surface, is heated by a hot plate 3 and maintained for several minutes to obtain the metal telluride film on one surface of the substrate 2.

Embodiment 2

Figure 2:
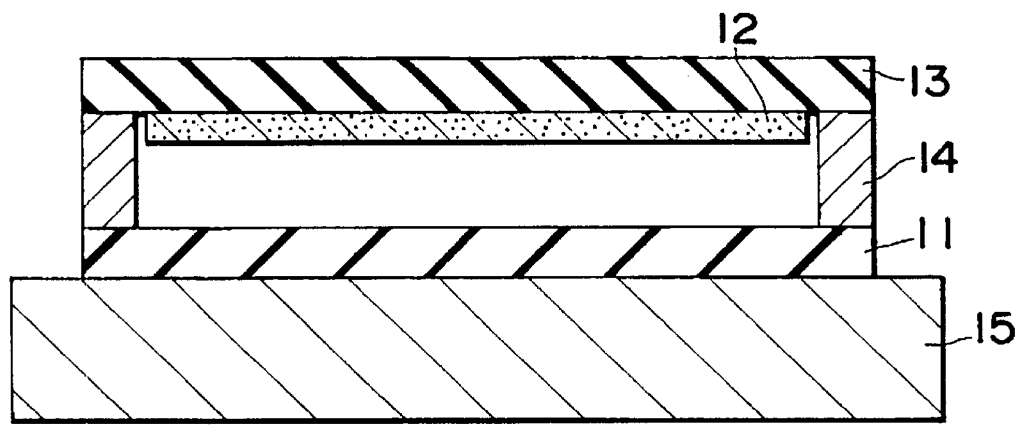
FIG. 2 is a schematic diagram showing a step of the embodiment 2 of the present invention.

FIG. 2 shows a second embodiment of the present invention.

A substrate 13, wherein a layer 12 of an organometallic compound having at least one tellurium-metal bond has been formed on one surface, is placed on a hot plate 15 in opposition to the substrate on which a metal telluride is to be formed through a spacer 14, facing the substrate 12 downward. By heating the substrate 13 to heat the organometallic compound layer 12 and the substrate 13 due to radiation heat from the substrate, a gas is evolved from the organometallic compound layer 12 and, at the same time, the above gas is pyrolytically decomposed on a substrate 11 whose temperature is higher than that of the above gas to obtain a metal telluride film on one surface of the substrate 11.

Embodiment 3

Figure 3:
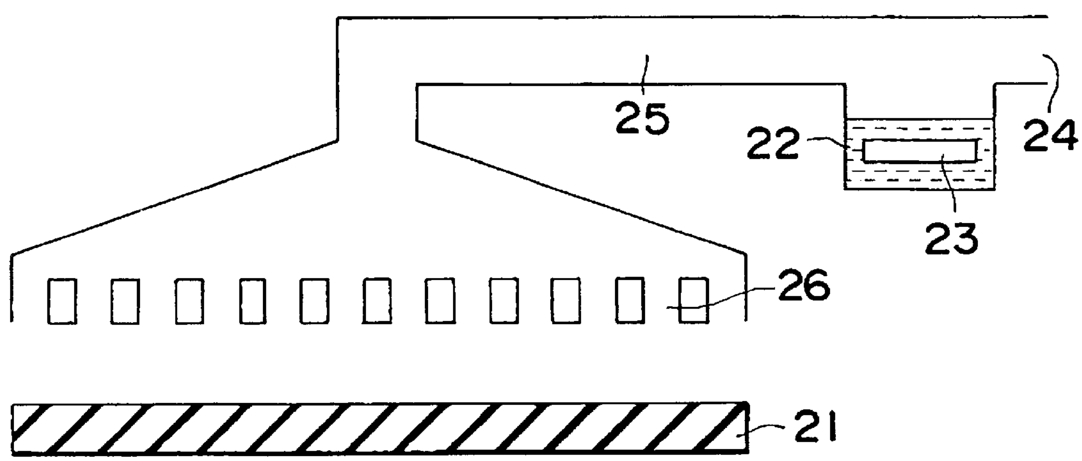
FIG. 3 is a schematic diagram showing a step of the embodiment 3 of the present invention.

FIG. 3 shows a third embodiment of the present invention.

An ultrasonic wave is applied to a solution 22 of an organometallic compound having at least one tellurium-metal bond by using an ultrasonic vibrator 23 to atomize the solution 22. The atomized solution 22 is fed to a nozzle 26 through a tube 25 by a gas fed from a gas introducing tube 24. A heated substrate 21 is located at a nozzle tip of the nozzle 26 and, when the atomized solution 22 is extruded out from the nozzle 26, the solution is pyrolytically decomposed on the surface of the substrate 21 to form a metal telluride film on the surface of the substrate 21.

Embodiment 4

Figure 4:
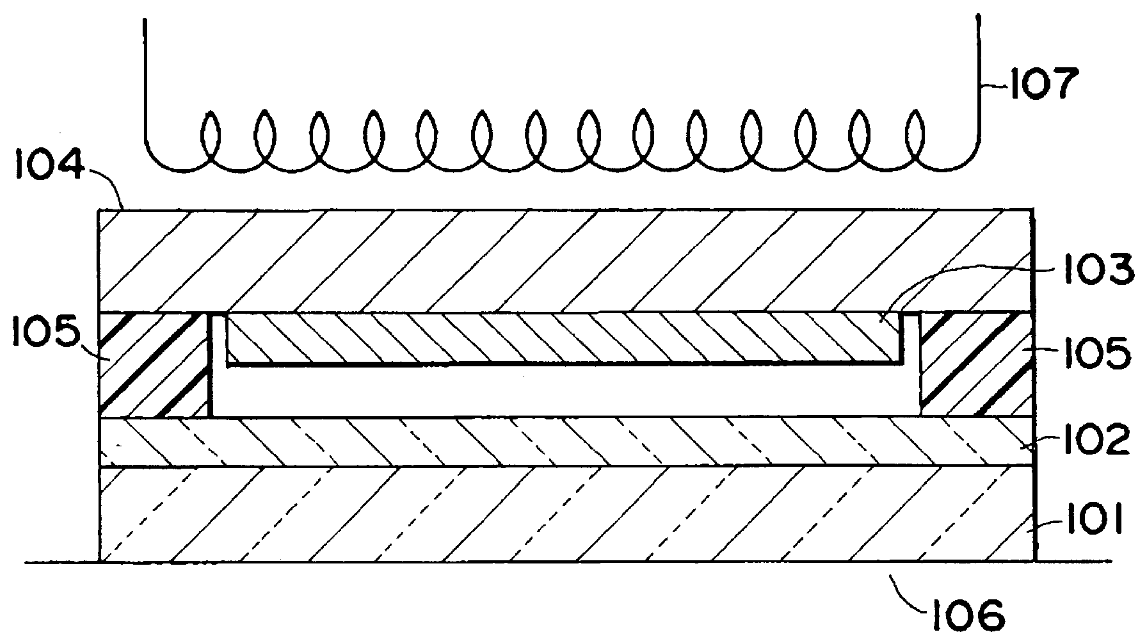
FIG. 4 is a schematic diagram showing a step of the embodiment 4 of the present invention.

FIG. 4 shows a structural diagram of a heat treatment step for forming a CdS film as a fourth embodiment of the present invention. A substrate 101 for forming a thin film having light transmission properties and conductivity, on which a film 102 having light transmission properties and conductivity has previously been formed, is proximately arranged in opposition to a heat resistant substrate 104 on which an organic Cd-S material 103 has been applied at an interval of several mm through a spacer 105. This is heated by a hot plate 106 and a heater 107 so that the temperature of the heat resistant substrate 104 becomes at least evaporation temperature of the organic Cd-S material and that of the substrate 102 for forming a thin film becomes at least decomposition temperature of the organic Cd-S material, thereby forming a CdS film on the substrate.

Embodiment 5

Figure 5:
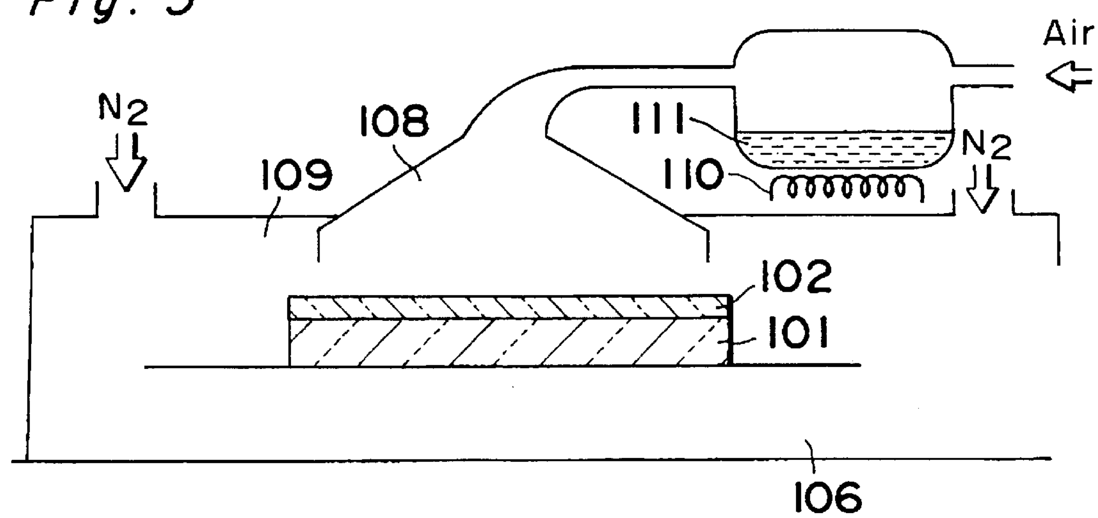
FIG. 5 is a schematic diagram showing a step of the embodiment 5 of the present invention.

FIG. 5 shows a structural diagram of a step for forming a CdS thin film as another embodiment of the present invention. Into a muffle furnace 109 whose muffle inner wall is provided with a gas jet 108, a substrate 101 for forming a thin film having light transmission properties and conductivity, on which a film 102 having light transmission properties and conductivity has previously been formed on one surface, is inserted. Then, an organic Cd-S material 111 is heated by a heater 110 as a heating equipment other than the muffle furnace 109 to evolve a gas. The gas is fed to the gas jet 108 and sprayed onto the substrate 101 for forming a thin film, which transfers at a suitable rate in the muffle furnace 109, to form a CdS film on the substrate.

Embodiment 6

Figure 6:
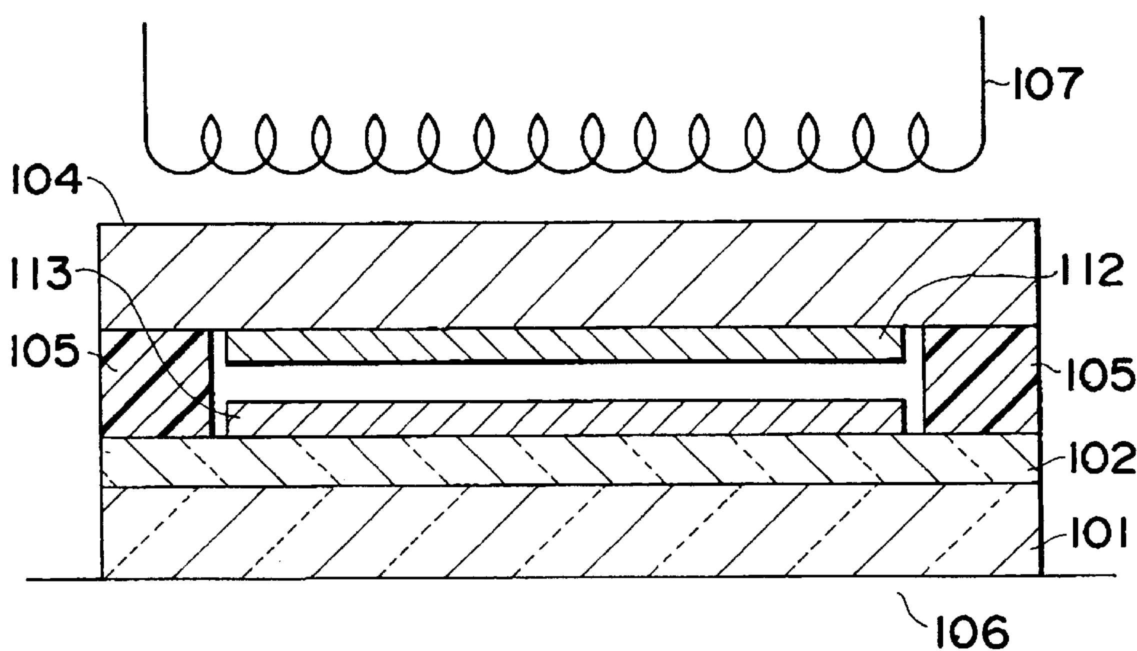
FIG. 6 is a schematic diagram showing a step of the embodiment 6 of the present invention.

FIG. 6 shows a structural diagram of a heat treatment step for forming a CdTe film as a sixth embodiment of the present invention. A substrate 101 for forming a thin film having light transmission properties and conductivity, on which a film 1 and a CdS film 13 having light transmission properties and conductivity have previously been formed, is proximately arranged in opposition to a heat resistant substrate 104 on which an organic Cd-Te material 112 has been applied at an interval of several mm through a spacer 105. This is heated by a hot plate 106 and a heater 107 so that the temperature of the heat resistant substrate 104 becomes at least evaporation temperature of the organic Cd-Te material and that of the substrate 102 for forming a thin film becomes at least decomposition temperature of the organic Cd-Te material, thereby forming a CdTe film on the substrate.

The following Examples of the present invention will be explained with reference to the accompanying drawings.

EXAMPLE 1

Bis(phenytelluro)cadmium ($Cd(PhTe)_2$) (1 mol, 522 g) as an organometallic compound having a tellurium-metal bond was mixed with 460 g of propylene glycol as a solvent for paste to prepare a paste having a viscosity of 800 centipoise. Incidentally, the kind or amount of the solvent is one condition for preparing the paste, and a suitable paste or ink can be easily prepared by adjusting the kind and amount of the solvent in the screen printing plate of other mesh number and other printing method.

Furthermore, since the particle size of particles of the compound varies depending on the synthesis condition of the organometallic compound, it is necessary to add the solvent in the amount which corresponds to the size of the particles.

The resulting paste was applied on a CdS film on a general-duty glass of 35 cm square by using a 80 mesh screen printing plate according to a screen printing method, and the substrate was dried at 120° C. to evaporate the solvent for paste. Then, the pyrolysis was conducted by heating in the atmosphere at 400° C. for 30 seconds to make a film. This pyrolysis is initiated when the temperature reaches 200° C. A black film having a thickness of 3 $\mu$m was obtained by this pyrolysis.

The (111) peak of cubic cadmium telluride (CdTe) was observed as a result of the analysis of the measuring results of X-ray diffraction of the film. Furthermore, a bond between Cd and Te of the film was analyzed by X-ray photoelectron spectroscopy. As a result, it was confirmed that the bond of Cd-Te is the same as that of Cd-Te of a single crystal CdTe. It was also confirmed by the analysis that carbon is hardly remained on the surface of or in the CdTe film.

EXAMPLE 2

Figure 7:
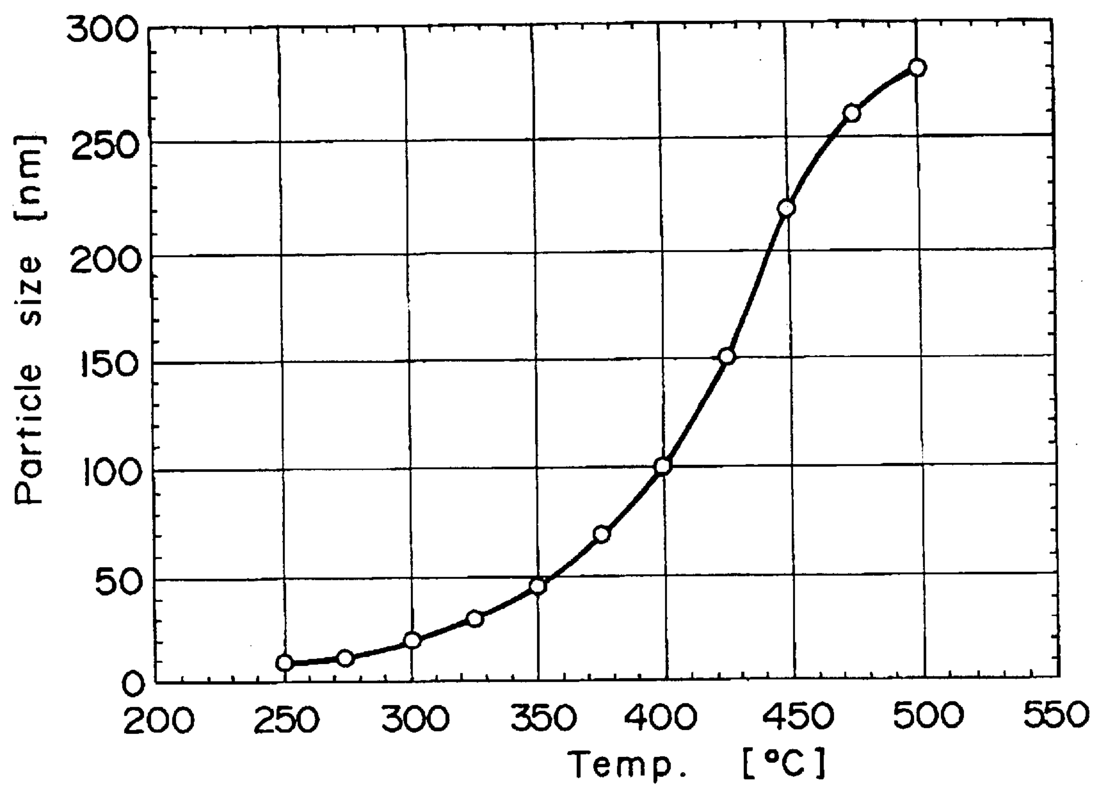
FIG. 7 is a graph showing a relation between the pyrolysis temperature and the particle size of CdTe.

A change in particle size of a film of CdTe made at the pyrolysis temperature in the atmosphere was measured by using the same manner as that described in Example 1. The results are shown in FIG. 7. The pyrolysis is initiated when the temperature reached 200° C. At the temperature of not more than 280° C., the particle size of CdTe became small such as not more than 10 nm. When using the film in a solar battery, the grain boundary increases when the particle size of CdTe is small, which results in deterioration of solar battery characteristics. Therefore, as is apparent from the results of FIG. 7, the pyrolysis temperature is preferably not less than 280° C. More preferably, the pyrolysis temperature is not less than 400° C. at which the particle size becomes not less than 10 nm so as to obtain higher performance.

EXAMPLE 3

Bis(trifluoromethylphenyltelluro)cadmium (1 mol) as an organometallic compound having a tellurium-metal bond was mixed with 500 g of N-dimethylformamide as a solvent for ink to prepare a paste having a viscosity of 50 centipoise. Incidentally, the kind or amount of the solvent is one condition for preparing the paste, and a suitable paste or ink can be easily prepared by adjusting the kind and amount of the solvent in the screen printing plate of other mesh number and other printing method. Furthermore, since the particle size of particles of the compound varies depending on the synthesis condition of the organometallic compound, it is necessary to add the solvent in the amount which corresponds to the size of the particles.

The resulting paste was applied on the surface a general-duty glass of 35 cm square, on which a $SnO_2$ film as a transparent conductive film and a CdS film having a thickness of 50 nm as a n type semiconductor have been formed in order, by using a 80 mesh intaglio printing plate made of urethane resin according to an intaglio printing method, and the substrate was dried at 90° C. to evaporate the solvent for paste. Then, the pyrolysis was conducted by heating in the atmosphere at 300° C. for 60 seconds to make a film. This pyrolysis is initiated when the temperature reaches 200° C. A black film having a thickness of 3 $\mu$m was obtained by this pyrolysis.

The (111) peak of cubic CdTe was observed as a result of the analysis of the measuring results of X-ray diffraction of the film. Furthermore, a bond between Cd and Te of the film was analyzed by X-ray photoelectron spectroscopy. As a result, it was confirmed that the bond of Cd-Te is the same as that of Cd-Te of a single crystal CdTe. It was also confirmed by the analysis that carbon is hardly remained on the surface of or in the CdTe film.

EXAMPLE 4

According to the same manner as that described in Example 1 except for preparing a paste having a viscosity of 800 centipoise by using the substance shown in (Table 1) in place of bis(phenyltelluro)cadmium as the organometallic compound having a tellurium-metal bond and mixing the substance with propylene glycol as the solvent for paste in the amount shown in (Table 1), a CdTe film was made and then analyzed in the same manner.

TABLE 1

| Organic compound | Molecular weight of organic compound | Amount of propylene glycol |
|---|---|---|
| $Cd(PhTe)_2$ | 521.792 | 460 g |
| $Cd(FPhTe)_2$ | 557.772 | 550 g |
| $Cd(MePhTe)_2$ | 549.838 | 500 g |
| $Cd(Me_2PhTe)_2$ | 577.884 | 510 g |
| $Cd(Me_3PhTe)_2$ | 605.930 | 540 g |
| $Cd(tBuPhTe)_2$ | 633.976 | 560 g |
| 8-$Cd(EtTe)_2$ | 425.704 | 380 g |
| $Cd(tBuTe)_2$ | 481.796 | 430 g |

As a result, similar to the case where bis(phenyltelluro) cadmium is used, the peak of cubic CdTe was confirmed. It was confirmed that the bond is the same as that of a single crystal CdTe.

EXAMPLE 5

According to the same manner as that described above except for preparing a paste having a viscosity of 800 centipoise by using the substance shown in (Table 2) in place of bis(phenyltelluro)cadmium as the organometallic compound having a tellurium-metal bond and mixing the substance with propylene glycol as the solvent for paste in the amount shown in (Table 2), a zinc telluride (ZnTe) film and a mercury telluride (HgTe) film were made and then analyzed in the same manner.

TABLE 2

| Organic compound | Molecular weight of organic compound | Amount of propylene glycol |
|---|---|---|
| $Zn(PhTe)_2$ | 474.762 | 430 g |
| $Zn(FPhTe)_2$ | 510.742 | 520 g |
| $Hg(PhTe)_2$ | 429.982 | 490 g |
| $Hg(FPhTe)_2$ | 465.962 | 580 g |

As a result, the peak of cubic ZnTe and that of HgTe were confirmed. It was confirmed that the bond is the same as that of a single crystal ZnTe and HgTe.

EXAMPLE 6

Bis(4-fluorophenyltelluro)cadmium ($Cd(FPhTe)_2$) (1 mol, 558 mol) as an organometallic compound having a tellurium-metal bond was mixed with the solvent shown in Table (3) in the amount shown in Table (3) to prepare printing ink having a viscosity of not more than 50 centipoise.

TABLE 3

| Kind of organic solvent | Amount of solvent (g) |
|---|---|
| Pyridine | 30 |
| Pyrrolidone | 23 |
| N-methyl-2-pyrrolidone | 10 |

Incidentally, the kind or amount of the solvent is one condition for preparing the paste, and a suitable paste or ink can be easily prepared by adjusting the kind and amount of the solvent in the screen printing plate of other mesh number and other printing method. Furthermore, since the particle size of particles of the compound varies depending on the synthesis condition of the organometallic compound, it is necessary to add the solvent in the amount which corresponds to the size of the particles.

A substrate wherein the formation of a CdTe film is studied is that obtained by forming ITO and a CdS film in order on one surface of a general-duty glass of 35 cm square, and the formation of a CdTe film on the CdS film surface of this substrate was studied. The ink was applied on the surface by using a 80 mesh screen printing plate according to a screen printing method, and the substrate was dried at 120° C. to evaporate the solvent for ink. Then, the pyrolysis was conducted by heating in the atmosphere at 400° C. for 30 seconds to make a film. This pyrolysis is initiated when the temperature reaches 200° C. In order to obtain a CdTe film constituting a solar battery, the pyrolysis temperature is preferably adjusted to not less than 280° C. This fact, however, does not apply to the case of the use other than the solar battery.

A black film having a thickness of 3 $\mu$m was obtained by this pyrolysis.

The (111) peak of cubic cadmium telluride was observed as a result of the analysis of the measuring results of X-ray diffraction of the film. Furthermore, a bond between Cd and Te of the film was analyzed by X-ray photoelectron spectroscopy. As a result, it was confirmed that the bond of Cd-Te is the same as that of Cd-Te of a single crystal CdTe. It was also confirmed by the analysis that carbon is hardly remained on the surface of or in the CdTe film.

The solubility of the organometallic compound in pyridine, pyrrolidine and N-methyl-2-pyrrolidone as the solvent used in the above (Table 3) was studied. The results are shown in (Table 4).

TABLE 4

| Organic compound | Pyridine | Pyrrolidone | N-methyl-2-pyrrolidone |
|---|---|---|---|
| $Cd(PhTe)_2$ | ◎ | ◎ | ◎ |
| $Cd(FPhTe)_2$ | ◎ | ◎ | ◎ |
| $Cd(MePhTe)_2$ | ○ | ○ | ○ |
| $Cd(Me_2PhTe)_2$ | ○ | ○ | ○ |
| $Cd(Me_3PhTe)_2$ | ○ | ○ | ○ |
| $Cd(tBuPhTe)_2$ | ○ | ○ | ○ |
| $Cd(EtTe)_2$ | ○ | ○ | ○ |
| $Cd(tBuTe)_2$ | ○ | ○ | ○ |
| $Zn(PhTe)_2$ | ◎ | ◎ | ◎ |
| $Zn(FPhTe)_2$ | ◎ | ◎ | ◎ |
| $Hg(PhTe)_2$ | ◎ | ◎ | ◎ |
| $Hg(FPhTe)_2$ | ◎ | ◎ | ◎ |

○: soluble (solubility is 5 to 10%)
◎: highly soluble (solubility is over 10%)

As is apparent from these results, the solubility is not less than 5% and the organometallic compound is partially dissolved in the solvent.

EXAMPLE 7

The formation of the CdTe film due to the kind of the substrate was studied. The substrate to be studied includes a general-duty glass surface of 35 cm square, a CdS film surface formed on one surface of the general-duty glass, an ITO surface formed on one surface of the general-duty glass, a carbon surface, a stainless steel surface and a mirror surface.

Bis(4-fluorophenyltelluro)cadmium (1 mol) as an organometallic compound having a tellurium-metal bond was mixed with 150 g of propylene glycol as a solvent for paste to prepare a paste having a viscosity of 800 centipoise. According to the same manner as that described in Example 4 except for the preparation of the paste, a CdTe film was made.

A black film having a thickness of 3 $\mu$m was obtained by this pyrolysis.

The (111) peak of cubic CdTe was observed as a result of the analysis of the measuring results of X-ray diffraction of the film. Furthermore, a bond between Cd and Te of the film was analyzed by X-ray photoelectron spectroscopy. As a result, it was confirmed that the bond of Cd-Te is the same as that of Cd-Te of a single crystal CdTe. It was also confirmed by the analysis that carbon is hardly remained on the surface of or in the CdTe film.

EXAMPLE 8

Bis(4-fluorophenyltelluro)cadmium (1 mol) as an organometallic compound having a tellurium-metal bond was mixed with an indium compound shown in (Table 5) in the amount shown in (Table 5) and 1100 g of propylene glycol as a solvent for paste to prepare a paste having a viscosity of 800 centipoise. As the Comparative Example, a paste containing no dopant was made in the same manner.

TABLE 5

| Kind of material | Amount to be added (g) |
|---|---|
| Tetraphenylindium | 0.005 |
| Bisacetyl(acetonato)indium | 0.02 |
| Indium octylate | 0.01 |

A substrate wherein the formation of a CdTe film is studied is that obtained by forming ITO and a CdS film in order on one surface of a general-duty glass of 35 cm square, and the formation of a CdTe film on the CdS film surface of this substrate was studied.

Each paste of this Example and Comparative Example was applied on the above surface by using a 80 mesh screen printing plate according to a screen printing method, and the substrate was dried at 120° C. to evaporate the solvent for paste. Then, the hydrolysis was conducted by heating at 400° C. for 30 seconds to make a film.

A black film having a thickness of 3 $\mu$m was obtained by this pyrolysis.

The (111) peak of cubic CdTe was observed as a result of the analysis of the measuring results of X-ray diffraction of the film. Furthermore, a bond between Cd and Te of the film was analyzed by X-ray photoelectron spectroscopy. As a result, it was confirmed that the bond of Cd-Te is the same as that of Cd-Te of a single crystal CdTe. It was also confirmed by the analysis that carbon is hardly remained on the surface of or in the CdTe film.

The carrier concentration of each film of this Example and Comparative Example was measured by the ECV method. As a result, regarding all films of this Example, the carrier concentration was increased compared with the film of the Comparative Example wherein no dopant was added. Furthermore, the photoluminescence of these films was measured. As a result, light emission of 14.5 meV was observed. Light emission of this energy is caused by the fact that indium (In) serves as a dopant by being arranged at the CdTe crystal lattice position to form a trap level of In in the CdTe film.

EXAMPLE 9

According to the same manner as that described in Example 6 except for changing In as a dopant used in Example 6 to Cu and using a copper compound shown in (Table 6) in the amount shown in (Table 6), a CdTe film was made.

TABLE 6

| Kind of material | Amount to be added (g) |
|---|---|
| Copper diethyldithiocarbamate | 0.01 |
| Copper chloride | 0.02 |

As a result, similar to Example 6, the peak of cubic CdTe was confirmed. It was also confirmed that the bond is the same as that of a single crystal CdTe. The carrier concentration of each film of this Example and Comparative Example was measured by the ECV method. As a result, regarding all films of this Example, the carrier concentration was increased compared with the film of the Comparative Example wherein no dopant was added. Furthermore, the photoluminescence of these films was measured. As a result, light emission of 147 meV was observed. Light emission of this energy is caused by the fact that Cu serves as a dopant by being arranged at the CdTe crystal lattice position to form a trap level of Cu in the CdTe film.

EXAMPLE 10

Figure 8:
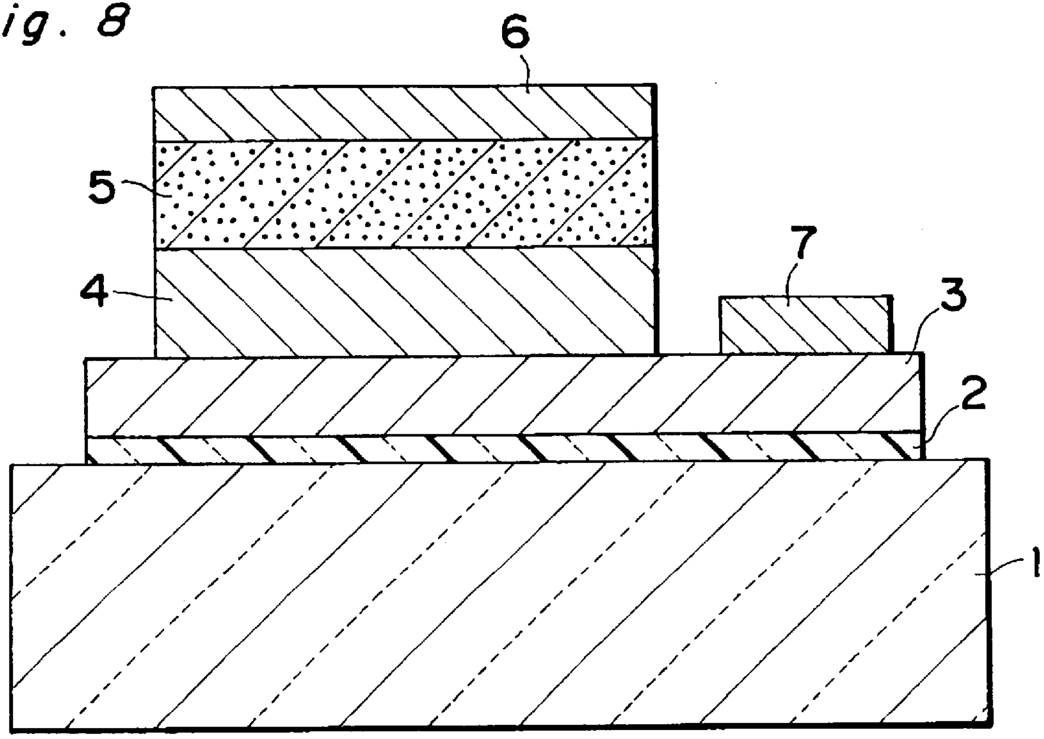
FIG. 8 is a structural sectional view showing a CdS/CdTe solar battery of the present invention.

A solar battery was constituted by using the CdTe film of the present invention. A structural sectional view of a CdS/CdTe solar battery is shown in FIG. 8. The method of producing the solar battery is as follows.

Using those prepared by forming a transparent conductive film 2 of ITO and a CdS thin film 3 in order on one surface of a general-duty 1 as the substrate, the paste was applied on a part of the CdS surface of this substrate in the same manner as that described in Example 1 and pyrolytically decomposed to form a CdTe film 4. After the CdTe film 4 was formed, an aqueous solution of $CdCl_2$ (1 mol/liter) was applied on the CdTe surface by spin coating in a room wherein the room temperature and humidity are maintained at about 20° C. and 30%, respectively. The spin coating was conducted at 1000 rpm. The particle size of CdTe is increased to not less than 1 μm by heating the applied substrate in nitrogen atmosphere at 400° C. for 120 minutes. Since this enlargement of the crystal reduces the grain boundary between CdTe particles, it is the size required for the CdTe film to serve as a semiconductor which constitutes a solar battery. Furthermore, a carbon electrode 5 was formed by printing a carbon paste on the CdTe film 4, drying with heating at 120° C. for 60 minutes, followed by heating at 375° C. for 15 minutes. An Ag electrode 6 was formed by printing an Ag paste on this carbon electrode, followed by drying with heating at 100° C. for 60 minutes. Furthermore, an AgIn electrode was formed on the CdS film 3 to constitute a solar battery. As the Comparative Example, a solar battery was constituted according to the same manner as that of this Example except for forming the CdTe film under reduced pressure of 1 torr under high-temperature condition of 600° C. according to the proximate sublimation method.

The characteristics of the solar batteries of the present invention and Comparative Example produced by the above method under light irradiation conditions of AM1.5 and 100 $mW/cm^2$ are shown in (Table 7).

TABLE 7

| | Present invention | Prior art |
|---|---|---|
| Open-circuit voltage (V) | 0.81 | 0.802 |
| Short-circuit current density ($mA/cm^2$) | 24.5 | 24.8 |
| Fill factor | 0.68 | 0.68 |
| Conversion efficiency (%) | 13.49 | 13.52 |

As a result, the solar battery of the present invention obtained the same output characteristics as those of the solar battery due to the proximate sublimation method of the Comparative Example. Consequently, according to the present invention, a CdTe film having high quality at low temperature under atmospheric pressure could be obtained.

EXAMPLE 11

To bis(octyltelluro)cadmium as an organometallic compound having a tellurium-metal bond, a suitable amount of ethylene glycol monophenyl ether as a solvent for paste was added and the mixture was kneaded to prepare printing ink having a viscosity of about 800 centipoise, which was printed on a glass as a substrate 13 by using a 80 mesh screen printing plate to form a substrate 13 on which an organometallic compound film 12 has been applied.

A glass spacer 14 having a thickness of 2 mm was placed on a glass, as a substrate 11, heated to 350° C. by a hot plate 15 and, furthermore, the substrate 13 was placed thereon in a state that the organometallic compound film 12 faces to the substrate 11, followed by standing for about 5 minutes. The organometallic compound film 12 applied on the substrate 13 is heated by heat radiation from the substrate 11 to convert into a gas. The gas is pyrolytically decomposed by contact with the surface of the substrate 11 and then placed on the substrate 11 to obtain a black film having a thickness of 3 μm.

The (111) peak of cubic cadmium telluride (CdTe) was observed as a result of the analysis of the measuring results of X-ray diffraction of the film. Furthermore, a bond between Cd and Te of the film was analyzed by X-ray photoelectron spectroscopy. As a result, it was confirmed that the bond of Cd-Te is the same as that of Cd-Te of a single crystal CdTe. It was also confirmed by the analysis that carbon is hardly remained on the surface of or in the CdTe film.

In this Example, as the solvent in which the organometallic compound is dissolved or dispersed, propylene glycol, pyridine and pyrrolidine were used, but other solvents such as dimethylformamide, dimethylacetamide, acetone, methanol, etc. can also be used. In this Example, a fixed amount of the solvent was used but is not necessarily used in the amount shown in this Example because it is necessary to adjust the amount according to the kind of the organometallic compound, kind of the solvent, kind of the printing method, etc. Furthermore, in this Example, those having a fixed viscosity were used but is not necessarily used those having the fixed viscosity shown in this Example because it is necessary to adjust the viscosity according to the kind of the printing method, mesh of the screen used for printing, thickness of the metal telluride film, etc. Furthermore, in this Example, the pyrolysis was conducted at the pyrolysis temperature of 300 to 400° C. but the same effect can be obtained in case of the temperature of 280 to 700° C. Incidentally, when the temperature is not more than 280° C., the particle size becomes small and the grain boundary increases. Therefore, it is not preferred in view of the solar battery characteristics.

EXAMPLE 12

In this Example, both CdS film and CdTe film were made by the VD method due to opposite substrates. First, the CdS film was made by the following method.

To cadmium diethyldithiocarbamate (100 g) as an organic Cd-S material, propylene glycol (30 g) as a solvent for paste is added and the mixture was kneaded to obtain a paste for printing. This paste is screen-printed on soda glass (100 mm×100 mm, 1.1 mm in thickness) as a heat resistant substrate by using a screen printing plate made of 165 mesh polypropylene. Then, propylene glycol is evaporated by heating to 120° C. in an oven with internal air circulation to form a cadmium diethyldithiocarbamate film on the heat resistant substrate.

Those obtained by forming an indium-tin oxide film (thickness: 250 nm) as a film having both light transmission properties and conductivity on a glass substrate (100 mm×100 mm, 1.1 mm in thickness) as a substrate having light transmission properties and conductivity are placed on a hot plate, facing the indium-tin oxide film upward and, furthermore, a spacer (3 mm×3 mm) having a thickness of 1 mm is placed on the four corners. On the spacer, the soda glass on which the cadmium diethyldithiocarbamate film has been formed is placed upside down so that the cadmium diethyldithiocarbamate film faces to the indium-tin oxide film. The resultant is heated at 400° C. and allowed to stand for 60 seconds to obtain a CdS film having a thickness of 100 nm on the indium-tin oxide film on the glass plate.

This film was subjected to X-ray mass spectrometric analysis. As a result, it was confirmed that this film is composed of CdS because the film contains cadmium and sulfur as a main component and shows the same X-ray diffraction pattern as that of the CdS (002) plane of a hexagonal system.

Then, a CdTe film was formed on the CdS film by the following method.

Bis(ethyltelluro)cadmium (liquid at room temperature) as an organic Cd-Te material is applied on soda glass (100 mm×100 mm, 1.1 mm in thickness) as a heat resistant substrate by dropping 15 ml of bis(ethyltelluro)cadmium, followed by rotating at 100 rpm for 30 seconds.

The above glass substrate on which the CdS film has been formed is placed on a hot plate, facing the CdS film upward, and a spacer (3 mm×3 mm) having a thickness of 1 mm is placed on the four corners. On the spacer, the soda glass on which the bis(ethyltelluro)cadmium film has been formed is placed upside down so that the bis(ethyltelluro)cadmium film faces to the CdS film. The resultant is heated at 450° C. and allowed to stand for 60 seconds to obtain a CdTe film having a thickness of 3 $\mu$m on the CdS film on the glass plate.

This film was subjected to X-ray mass spectrometric analysis. As a result, it was confirmed that this film is composed of CdTe because the film contains cadmium and tellurium as a main component and shows the same X-ray diffraction pattern as that of the CdTe (111) plane of a hexagonal system.

On the substrate on which the CdS film and CdTe film have been formed, a carbon electrode was formed on a part of the CdTe film and, after removing the peripheral CdTe film which is 500 $\mu$m away from the carbon electrode, a silver-indium electrode was formed on the carbon electrode and the portion where the CdTe film was removed, thereby affording a solar battery.

The characteristics of this solar battery were measured by light irradiation from a standard light source of 100 mW/cm$^2$. As a result, the output end open-circuit voltage (Voc) was 0.80 V, the output end short-circuit current density (Isc) was 24 mA/cm$^2$, the fill factor (FF) was 68%, and the conversion efficiency was 13.6%.

EXAMPLE 13

According to the same manner as that described in Example 12 except for using a tin oxide film in place of the indium-tin oxide film as the film having both light transmission properties and conductivity, a solar battery was made.

The characteristics of this solar battery were measured by light irradiation from a standard light source of 100 mW/cm$^2$. As a result, the output end open-circuit voltage (Voc) was 0.80 V, the output end short-circuit current density (Isc) was 23 mA/cm$^2$, the fill factor (FF) was 68%, and the conversion efficiency was 12.5%.

EXAMPLE 14

According to the same manner as that described in Example 12 except for using a zinc oxide film in place of the indium-tin oxide film as the film having both light transmission properties and conductivity, a solar battery was made.

The characteristics of this solar battery were measured by light irradiation from a standard light source of 100 mW/cm$^2$. As a result, the output end open-circuit voltage (Voc) was 0.79 V, the output end short-circuit current density (Isc) was 22.5 mA/cm$^2$, the fill factor (FF) was 66%, and the conversion efficiency was 11.7%.

EXAMPLE 15

In this Example, the CdS film was made by the VD method due to spraying of vapor and the CdTe film was made by the VD method due to opposite substrates. First, the CdS film was made by the following method.

As shown in FIG. 5, cadmium dimethyldithiocarbamate (100 g) as an organic Cd-S material was charged in a heating container equipped with two tubes, a feed tube and an exhaust tube, and then heated to 300° C. in a state that air is introduced through the feed tube in a flow amount of 100 ml/minute, thereby evolving vapor of the organic Cd-S material. This vapor was exhausted through the exhaust tube and sprayed onto an indium-tin oxide film (thickness: 250 nm) formed on one surface of a glass plate (100 mm×100 mm, 1.1 mm in thickness) for 5 minutes to obtain a CdS film having a thickness of about 100 nm on the indium-tin oxide film.

Then, according to the same manner as that described in Example 12 except for using bis(tertiary butyrotelluro) cadmium (liquid at room temperature) in place of bis (ethyltelluro)cadmium as the organic Cd-Te material, a CdTe film was made on the CdS film. Furthermore, an electrode was formed according the same manner as that described in Example 1 to obtain a solar battery.

The characteristics of this solar battery were measured by light irradiation from a standard light source of 100 mW/cm$^2$. As a result, the output end open-circuit voltage (Voc) was 0.80 V, the output end short-circuit current density (Isc) was 23 mA/cm$^2$, the fill factor (FF) was 68%, and the conversion efficiency was 12.5%.

EXAMPLE 16

In this Example, the CdS film was made by the LD method of pyrolytically decomposing, directly, and the CdTe film was made by the VD method due to opposite substrates. First, the CdS film was made by the following method.

Cadmium isopropylxanthogenate (1.2 mol/liter) as an organic Cd-S material was dissolved in N-methyl-2-pyrrolidone as a solvent for ink to prepare ink having a viscosity of about 500 centipoise. This ink was applied on an indium-tin oxide film (thickness: 250 nm) formed on one surface of a glass substrate (100 mm×100 mm, 1.1 mm in thickness) by using flexographic printing, and the applied substrate was heated at 110° C. for 30 minutes to evaporate the solvent. Then, the substrate was subjected to a heat treatment by heating in the atmosphere at 450° C. for 3 minutes using a hot plate to obtain a CdS film having a thickness of 10 nm on the indium-tin oxide film.

This film was subjected to X-ray mass spectrometric analysis. As a result, it was confirmed that this film is composed of CdS because the film contains cadmium and sulfur as a main component and shows the same X-ray diffraction pattern as that of the CdS (002) plane of a hexagonal system.

Then, according to the same manner as that described in Example 12 except for using bis(methyltelluro)cadmium (liquid at room temperature) in place of bis(ethyltelluro) cadmium as the organic Cd-Te material, a CdTe film was made on the CdS film.

Furthermore, an electrode was formed according the same manner as that described in Example 1 to obtain a solar battery.

The characteristics of this solar battery were measured by light irradiation from a standard light source of 100 $mW/cm^2$. As a result, the output end open-circuit voltage (Voc) was 0.78 V, the output end short-circuit current density (Isc) was 23 $mA/cm^2$, the fill factor (FF) was 68%, and the conversion efficiency was 12.2%.

EXAMPLE 17

In this Example, the CdS film was made by the VD method due to opposite substrates and the CdTe film was made by the LD method of pyrolytically decomposing, directly.

According to the same manner as that described in Example 12 except for using cadmium dibutyldithiocarbamate in place of cadmium diethyldithiocarbamate as the organic Cd-S material, a CdS film was made.

Then, a CdTe film was made on the CdS film by the following method.

Bisphenyltellurocadmium as the organic Cd-Te material is mixed with pyrrolidine as the solvent for ink to prepare ink having a viscosity of 50 centipoise. On the CdS film obtained by the above method, the same paste was applied by using a 80 mesh screen according to the screen printing method and the solvent for paste is evaporated by drying at 120° C.

Then, the pyrolysis was conducted by heating in the atmosphere at 450° C. for 30 seconds to form a film. This pyrolysis is initiated when the temperature reaches 200° C. In order to obtain a CdTe film constituting a solar battery, the pyrolysis temperature is preferably adjusted to not less than 280° C. This fact, however, does not apply to the case of the use other than the solar battery.

A black film having a thickness of 3 μm was obtained by this pyrolysis.

The (111), (200) and (311) peaks of cubic CdTe were observed as a result of the analysis of the measuring results of X-ray diffraction of the film.

Furthermore, a bond between Cd and Te of the film was analyzed by X-ray photoelectron spectroscopy. As a result, it was confirmed that the Cd-Te bond is the same as that of a single crystal CdTe. It was also confirmed by the analysis that carbon is hardly remained on the surface of or in the CdTe film.

On this substrate, an electrode was formed according to the same manner as that described in Example 1 to give a solar battery. The characteristics of this solar battery were measured by light irradiation from a standard light source of 100 $mW/cm^2$. As a result, the output end open-circuit voltage (Voc) was 0.77 V, the output end short-circuit current density (Isc) was 23 $mA/cm^2$, the fill factor (FF) was 67%, and the conversion efficiency was 11.9%.

EXAMPLE 18

In this Example, both CdS film and CdTe film were made by the LD method of pyrolytically decomposing, directly. First, the CdS film was made by the following method.

Cadmium n-butylxanthogenate (1.2 mol/liter) as an organic Cd-S material is dissolved in N-methyl-2-pyrrolidone as a solvent for ink to prepare ink having a viscosity of about 50 centipoise. This ink is applied on a tin oxide film (thickness: 250 nm) formed on one surface of a glass substrate (100 mm×100 mm, 1.1 mm in thickness) in a thickness of 600 nm by using a spin coating method, and the applied substrate is heated at 110° C. for 30 minutes to evaporate the solvent. Then, the substrate is subjected to a heat treatment by heating with a hot plate in the atmosphere at 450° C. for 3 minutes to obtain a CdS film having a thickness of 100 nm on the tin oxide film. This film was subjected to X-ray mass spectrometric analysis. As a result, it was confirmed that this film is composed of CdS because the film contains cadmium and sulfur as a main component and shows the same X-ray diffraction pattern as that of the CdS (002) plane of a hexagonal system.

Then, a CdTe film was made on the CdS film by the following method.

Bis(4-fluorophenyltelluro)cadmium (1 mol) as the organic Cd-Te material is mixed with N-methyl-2-pyrrolidine (700 g) as the solvent for ink to prepare ink having a viscosity of 800 centipoise. On the glass substrate on which the CdS film has been formed by the above method, a bis(4-fluorophenyltelluro)cadmium film having a thickness of 5 μm is formed by flexographic printing. Then, the pyrolysis was conducted by heating in the atmosphere at 450° C. for 30 seconds to form a film. This pyrolysis is initiated when the temperature reaches 200° C. In order to obtain a CdTe film constituting a solar battery, the pyrolysis temperature is preferably adjusted to not less than 280° C. This fact, however, does not apply to the case of the use other than the solar battery.

A black film having a thickness of 3 μm was obtained by this pyrolysis.

The (111), (200) and (311) peaks of cubic CdTe were observed as a result of the analysis of the measuring results of X-ray diffraction of the film.

Furthermore, a bond between Cd and Te of the film was analyzed by X-ray photoelectron spectroscopy. As a result, it was confirmed that the Cd-Te bond is the same as that of a single crystal CdTe. It was also confirmed by the analysis that carbon is hardly remained on the surface of or in the CdTe film.

On this substrate, an electrode was formed according to the same manner as that described in Example 1 to give a solar battery. The characteristics of this solar battery were measured by light irradiation from a standard light source of 100 $mW/cm^2$. As a result, the output end open-circuit voltage (Voc) was 0.77 V, the output end short-circuit current density (Isc) was 23 $mA/cm^2$, the fill factor (FF) was 67%, and the conversion efficiency was 11.9%.

COMPARATIVE EXAMPLE 1

As the Comparative Example, both CdS film and CdTe film were made by a conventional sintering method to constitute a solar battery.

A CdS layer was applied on a high melting point glass substrate by the screen printing method, followed by sintering at the temperature of about 700° C. to prepare a CdS layer as a n type semiconductor. Then, a CdTe layer was applied in the same manner, followed by sintering at about 700° C. to prepare a CdTe layer.

On this substrate, an electrode was formed in the same manner as that described in Example 1 to afford a solar battery. The characteristics of this solar battery were measured by light irradiation from a standard light source of 100 $mW/cm^2$. As a result, the output end open-circuit voltage (Voc) was 0.804 V, the output end short-circuit current density (Isc) was 20 $mA/cm^2$, the fill factor (FF) was 64%, and the conversion efficiency was 10.3%.

In this Example, the case where cadmium diethyldithiocarbamate is used as the organic Cd-S material of the VD method was adopted, but this method can be applied in case of the organometallic compound having at least one bond between sulfur and cadmium, which is heated to evolve vapor. Examples of the material include cadmium dimethyldithiocarbamate, cadmium dibutylthiocarbamate, cadmium dibenzyldithiocarbamate, cadmium mercaptide, cadmium thioate, cadmium dithioate, thiocarbonate cadmium, dithiocarbonate cadmium, cadmium thiocarbamate and the like, but are not limited thereto.

In this Example, the case where cadmium diethyldithiocarbamate is used as the organic Cd-S material of the LD method was explained, but this method can be applied in case of the organometallic compound having at least one bond between sulfur and cadmium, which is dissolved in an organic solvent (e.g., N-methyl-2-pyrrolidone, dimethylformamide, tetralin, toluene, chloroform, etc.) or is liquid at a normal temperature.

Examples of the material include cadmium dimethyldithiocarbamate, cadmium dibenzyldithiocarbamate, cadmium mercaptide, cadmium thioate, cadmium dithioate, thiocarbonate cadmium, dithiocarbonate cadmium, cadmium thiocarbamate and the like, but are not limited thereto.

In this Example, the case where bis(ethyltelluro)cadmium is used as the organic Cd-Te material was explained, but the organic Cd-Te material is not limited thereto and this method can be applied in case of the organometallic compound having at least one bond between tellurium and cadmium, which is heated to evolve vapor. Examples of the material include bis(methyltelluro)cadmium, bis(butyltelluro) cadmium, bis(tertiary butyrotelluro)cadmium, bis (octyltelluro)cadmium, etc., but are not limited thereto.

Incidentally, the kind or amount of the solvent in this Example is one condition for preparing the paste, and suitable ink must be prepared by adjusting the kind and amount of the solvent in the screen printing plate.

EFFECT OF THE INVENTION

As described above, according to the present invention, it becomes possible to form a II–VI group compound semiconductor film such as telluride metal film on the surface of a desired substrate by using an organometallic compound containing at least one metal-tellurium bond as the material and subjecting to a heat treatment in the atmosphere at low temperature of not more than 600° C. for several minutes. Furthermore, it becomes possible to form a doped metal telluride film by incorporating a suitable amount of a material containing an device serving as a dopant into the above organometallic compound.

The time required to make a film is decided by the pyrolysis rate, but the pyrolysis is completed within the range from several to several ten of seconds.

Furthermore, a high-performance solar battery can be easily obtained by constituting the solar battery with the CdTe film produced by the above method.

What is claimed is:

1. A method of preparing semiconductor layers under atmospheric pressure to constitute a p-n junction used for a photoelectric transfer device, wherein each of said semiconductor layers comprises a II–VI atom chemically bonding compound in which the Group 11 atom is selected from the group consisting of Cd, Zn, and Hg, and the Group VI atom is Te, which comprises coating a substrate with a liquid composition containing an organometallic compound represented by the formula: R-Te-M-Te-R, wherein M is Cd, Zn or Hg, and R is phenyl, alkylphenyl or fluorophenyl, and then pyrolytically decomposing said organometallic compound whereby at least one of said p and n layers is formed on the substrate by the pyrolytic decomposing.

2. A method of preparing semiconductor layers under atmospheric pressure to constitute a p-n junction used for a photoelectric transfer device, wherein each of said semiconductor layers comprises a II–VI atom chemically bonding compound in which the Group 11 atom is selected from the group consisting of Cd, Zn, and Hg, and the Group VI atom is Te, which comprises heating to a high temperature the surface of a substrate and then contacting said heated surface with a gaseous composition under atmospheric pressure containing an organometallic compound represented by the formula: R-Te-M-Te-R, wherein M is Cd, Zn or Hg, and R is phenyl, alkylphenyl or fluorophenyl, and then pyrolytically decomposing said organometallic compound whereby at least one of said p and n layers is formed on the substrate by the pyrolytic decomposing.

3. A method of preparing semiconductor layers under atmospheric pressure to constitute a p-n junction used for a photoelectric transfer device, wherein each of said semiconductor layers comprises a II–VI atom chemically bonding compound in which the Group II atom is selected from the group consisting of Cd, Zn, and Hg, and the Group VI atom is Te, which comprises heating to a high temperature the surface of a substrate and then contacting said heated surface with a powder type or liquid type composition to be sprayed, said composition containing an organometallic compound represented by the formula: R-Te-M-Te-R, wherein M is Cd, Zn or Hg, and R is phenyl, alkylphenyl or fluorophenyl, and then pyrolytically decomposing said organometallic compound whereby at least one of said p and n layers is formed on the substrate by the pyrolytic decomposing.

4. The method of preparing semiconductor layers according to claim 1, wherein said organometallic compound contains a dopant selected from the group consisting of Cu, Ag, Li, Na and In.

5. The method of preparing semiconductor layers according to claim 2, wherein said organometallic compound contains a dopant selected from the group consisting of Cu, Ag, Li, Na and In.

6. The method of preparing semiconductor layers according to claim 3, wherein said organometallic compound contains a dopant selected from the group consisting of Cu, Ag, Li, Na and In.

7. The method of preparing semiconductor layers according to claim 1, wherein said coating composition is a paste or solution containing said organometallic compound, and said semiconductor layer is formed by applying said paste or solution on said substrate according to a printing method or a spin coating method and evaporating a solvent from the coating applied on the substrate.

8. A method of preparing semiconductor layers according to claim 7, wherein said printing method is selected from the group consisting of letterpress printing, intaglio printing, lithographic printing, stencil printing and cascade printing.

9. The method of preparing semiconductor layers according to claim 7, wherein the solvent used for dispersing or dissolving said organometallic compound is selected from the group consisting of 1-methyl-2-pyrrolidone, dimethylformamide, pyridine, γ-butyrolactone, tetralin, dimethyl sulfoxide, toluene, chloroform, alcohols, polyhydric alcohol and a derivative thereof including diethylene glycol monoalkyl ether and ethylene glycol monoalkyl ether and water.

10. The method of preparing semiconductor layers according to claim 1, wherein the step of decomposing the organometallic compound is carried out at a temperature from 280° C. to 600° C.

11. The method of preparing semiconductor layers according to claim 1, wherein the step of decomposing the organometallic compound is carried out at an atmosphere selected from the group consisting of an inert gas, an inert gas containing oxygen and air.

12. A method of preparing semiconductor layers to constitute a p-n junction used for a photoelectric transfer device, wherein each of said semiconductor layers comprises a II–VI atom chemically bonding compound in which the Group II atom is Cd and the Group VI atom is S, which comprises providing a substrate and then pyrolytically decomposing an organometallic compound having Cd-S bonding which is selected from the group consisting of mercapatide, thiosulfate, dithiosulfate, thiocarboxylate, dithiocarboxylate, thiocarbamate, and dithiocarbamate of cadmium.

13. A method of preparing semiconductor layers to constitute a p-n junction used for solar cell comprising a p-type Cd-S compound semiconductor and a layer of Cd-Te p-type semiconductor laminated thereon, wherein said Cd-S compound semiconductor layer is prepared by the method according to claim 12.

* * * * *